United States Patent [19]

Blake et al.

[11] Patent Number: 5,422,583
[45] Date of Patent: Jun. 6, 1995

[54] BACK GATE SWITCHED SAMPLE AND HOLD CIRCUIT

[75] Inventors: John Blake, Highworth; Anthony Gribben, Newbury; Colin Price, Newbury, all of England

[73] Assignee: Analog Devices Inc., Norwood, Mass.

[21] Appl. No.: 207,856

[22] Filed: Mar. 8, 1994

[51] Int. Cl.⁶ ............................................. H03K 17/00
[52] U.S. Cl. .............................. 327/94; 327/91; 327/124; 327/534
[58] Field of Search ............ 327/91, 94, 124, 390, 327/534, 535, 536, 537, 538, 543, 545, 546, 589

[56] References Cited

U.S. PATENT DOCUMENTS

| | | | |
|---|---|---|---|
| 4,308,468 | 12/1981 | Olson | 327/94 |
| 4,365,174 | 12/1982 | Kucharewski | 327/91 |
| 4,862,016 | 8/1989 | Genrich | 327/94 |
| 5,084,634 | 1/1992 | Gorecki | 327/91 |
| 5,138,186 | 8/1992 | Dumbovic | 327/91 |
| 5,324,995 | 6/1994 | Yee | 327/91 |

*Primary Examiner*—Terry D. Cunningham
*Attorney, Agent, or Firm*—Joseph S. Iandiorio; Kirk Teska; Iandiorio and Teska

[57] ABSTRACT

An improved back gate switched sample and hold circuit includes a sample and hold channel including a sample switch having a back gate and a storage element; a back gate circuit for controlling the back gate of the sample switch; and a first attenuator circuit for scaling the input signal from a low impedance source for delivery to the sample switch and a second attenuator circuit responsive to the input signal from the low impedance source to independently drive the back gate circuit and isolate any distortion of the input signal in the back gate circuit from affecting the input signal in said sample and hold channel.

11 Claims, 2 Drawing Sheets

BACK GATE SWITCHED SAMPLE AND HOLD CIRCUIT

FIELD OF INVENTION

This invention relates to an improved back gate switched sample and hold circuit, and more particularly to such a circuit which isolates from the input signal submitted to the main sample and hold channel the distortion of the input signal used to drive the back gate circuit.

BACKGROUND OF INVENTION

Sample and hold channels typically use a switch to capture a signal and a storage element to hold the captured or sampled signal. The switch is usually a semiconductor device such as a transistor, e.g. an FET, and the storage device is a capacitor. An attenuator circuit receives the input signal and scales it to the amplitude range acceptable to the system. These sampling transistors are, however, not perfect switches: their on resistance and the capacitance seen by the channel are both non-linear functions of the input voltage being sampled. These non-linearities, particularly at high speed, lead to distortion of the sampled signal. To improve this a back gate circuit has been introduced. The scaled input voltage at the output of the attenuator circuit is split: part goes to the main sample and hold channel and part goes to the back gate circuit. The back gate circuit connects the input signal to the back gate during the sample part of the operation so that the back gate voltage tracks the voltage applied to the main transistor terminals. This minimizes the voltage differential across the transistor junction and thus lowers the on resistance of the device thereby reducing the non-linear effects. Increasing the size of the switch also does this but there comes a point at which the improvements due to reducing the on resistance are less valuable than the deterioration due to increasing the non-linear capacitance. When the back gate of the MOS device is switched, the non-linear capacitance from the channel to the back gate disappears, since the channel and back gate are at the same potential, but instead the capacitance from the back gate (p-well) to the substrate (n-type) is seen. This capacitance is usually more non-linear since the doping concentrations in these two regions are generally lower.

SUMMARY OF INVENTION

It is therefore an object of this invention to provide an improved back gate switched sample and hold circuit.

It is a further object of this invention to provide an improved back gate switched sample and hold circuit in which both the on resistance and the back gate to substrate parasitic capacitance are reduced.

It is a further object of this invention to provide an improved back gate switched sample and hold circuit which employs small, passive, easily fabricated element.

The invention results from the realization that a truly improved sample and hold channel can be effected by using a second attenuator circuit to provide the input signal to the back gate circuit so that the input signal submitted to each of the sample and hold channel and the back gate circuits is derived from the low impedance of the input signal source serving the attenuator circuits and the distortions suffered by the input signal submitted to the back gate circuit are not reflected in the input signal submitted to the main sample and hold circuit.

This invention features an improved back gate switched sample and hold circuit. There is a sample and hold channel including a sample switch which has a back gate and storage element. There is a back gate circuit for controlling the back gate of the sample switch. A first attenuator circuit scales the input signal from a low impedance source for delivery to the sample switch and a second attenuator circuit responsive to the input signal from the low impedance source independently drives the back gate circuit and isolates any distortion of the input signal in the back gate circuit from affecting the input signal in the sample and hold channel.

In a preferred embodiment, first and second attenuator circuits may be first and second resistance circuits, respectively. The resistance circuits may have substantially identical resistances or they may be proportional resistances. The second resistance circuit may include resistances which are proportionately significantly greater than the resistances of the first resistance circuit. The sample switch may be a transistor such as an FET transistor and the storage element may be a capacitor. The back gate circuit may include a sampling switch for connecting the input signal to the back gate during the sample operation and a holding switch for connecting the back gate to ground during the hold operation. Both the sampling switch and the holding switch may be transistors such as FETs.

DISCLOSURE OF PREFERRED EMBODIMENT

Other objects, features and advantages will occur to those skilled in the art from the following description of a preferred embodiment and the accompanying drawings, in which.

Figure 1:
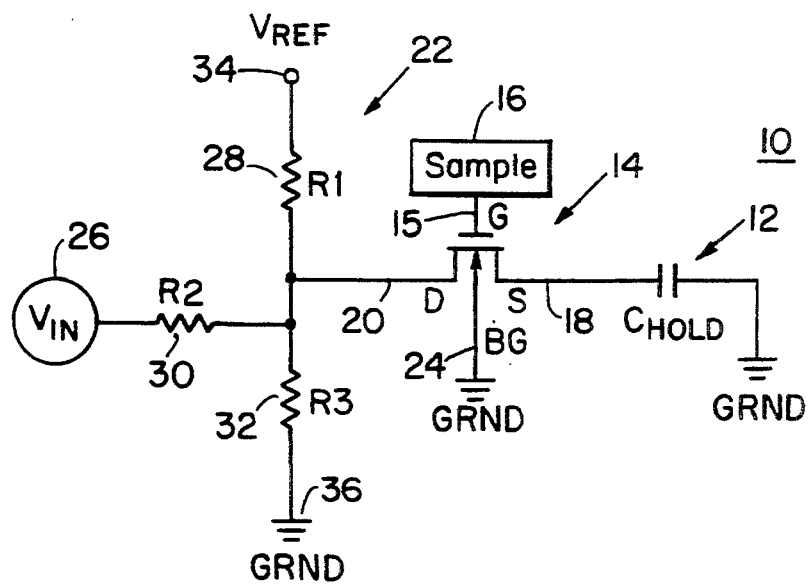
FIG. 1 is a schematic diagram of a prior art sample and hold channel.
Figure 2:
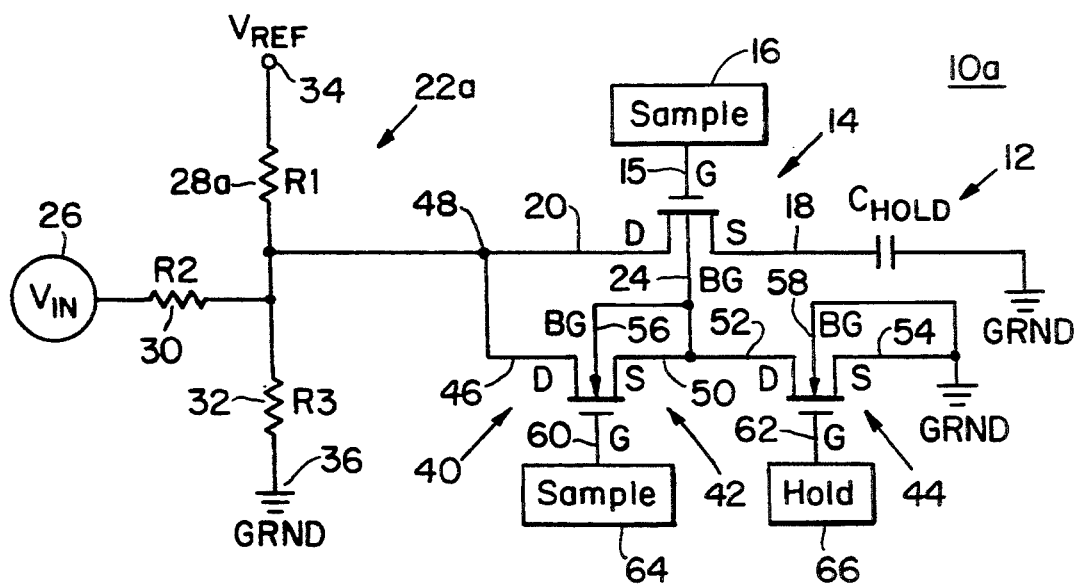
FIG. 2 is a schematic diagram of a prior art sample and hold channel employing a back gate switched circuit.

There is shown in FIG. 1 a prior art sample and hold circuit 10 which includes a capacitance 12 for storing the sample signal and an FET transistor 14 for sampling the input signal. FET 14 has its gate 15 connected to a sample signal source 16 which periodically calls for a sampling operation. The source terminal 18 is connected to capacitor 12 while the drain 20 is connected to attenuator circuit 22. Back gate 24 is connected to ground. Attenuator network 22 has its input connected to a low impedance source 26 which supplies the input signal $V_{in}$. Attenuator circuit 22 includes three resistances $R_1$, $R_2$, $R_3$, 28, 30 and 32, respectively. One end of resistance network 22 is connected to $V_{ref}$ at terminal 34; the other is connected to ground at terminal 36. The FET suffers from a reasonably high on resistance and further from an on resistance which varies with the amplitude of the input signal applied. To overcome this, one approach in the prior art, FIG. 2, is to add a back gate circuit 40 which included a sampling switch 42 and a holding switch 44, both of which are implemented in FIG. 2 with FET transistors. Sampling switch 42 has its drain connected to terminal 46 at the high impedance output of attenuator 22. Its source is connected to the back gate 24 of sample switch 14 and to the drain of sampling switch 44. The drain 46 of sampling switch 42 is connected to the high-impedance output terminal 48 of attenuator 22. The source 50 of sampling switch 42 is connected to the back gate 24 of sample switch 14 and to the drain 52 of sampling switch 44. The source 54 of sampling switch 44 is connected to ground. Both of the back gates 56 and 58 of sampling switch 42 and holding switch 44 are connected to the sources 50 and 54, respectively. The gates 60 and 62 of sampling switches 42 and 44 are connected respectively to a source of the sampling signal 64 and the holding signal 66. Generally, source 64 is the same signal as source 16. Thus during the sampling portion of the cycle the operation of sampling switch 42 applies the input signal to back gate 24 of main sample switch 14. This causes the voltage on the back gate to track closely the voltage on the drain and source terminals 20 and 18, respectively, of the main sample switch 14. This significantly reduces the on resistance of sample switch 14. During the hold portion of the cycle a holding signal from source 66 drives gate 62 so that holding switch 44 connects ground to back gate 24, thereby preventing any discharge of holding capacitor 12 back through sample switch 14.

Figure 3:
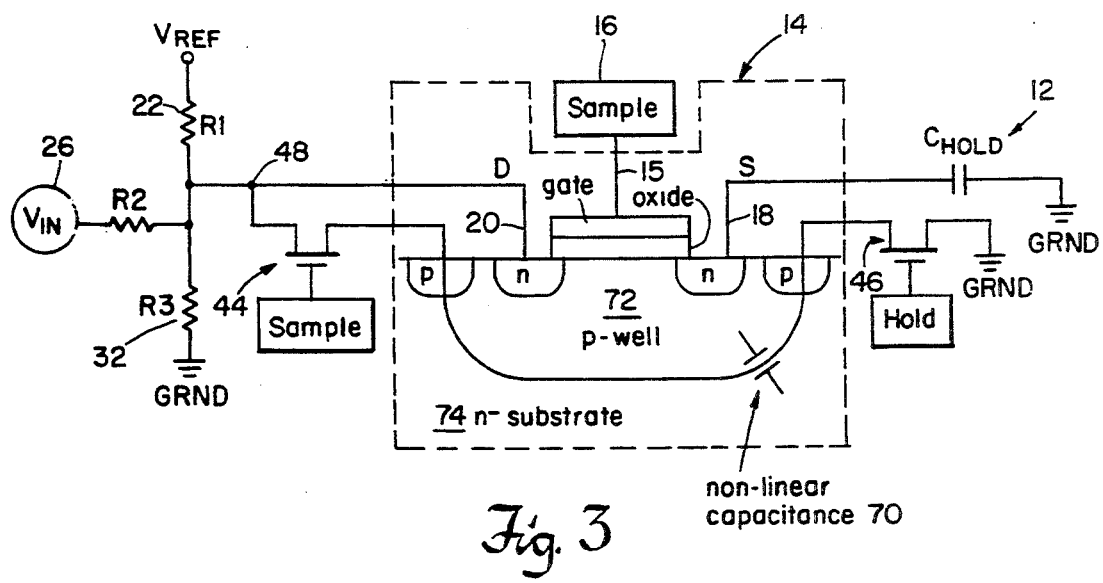
FIG. 3 is a schematic diagram illustrating the junction construction of the sample and hold FET of FIGS. 1 and 2 depicting the parasitic capacitance between the back gate and substrate.
Figure 4:
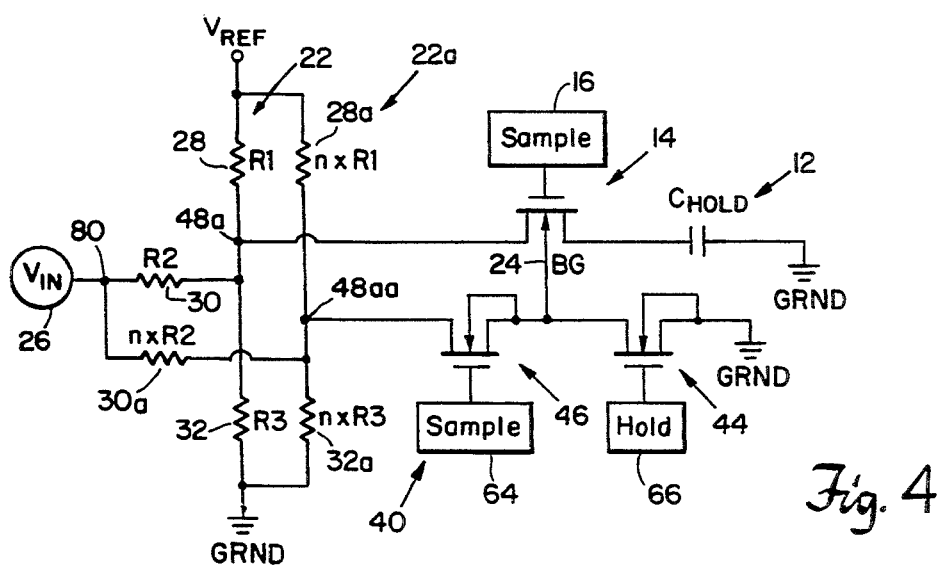
FIG. 4 is a schematic diagram of the improved back gate switched sample and hold circuit according to this invention.

While control circuit 40, FIG. 2, thus reduces the problem of the varying resistance of sample switch 14, it introduces another problem. As shown in FIG. 3, there is a large non-linear parasitic capacitance 70 between the back gate P well 72 and the adjacent N substrate 74. This is addressed by this invention, FIG. 4, by employing a second attenuator circuit 22a similar to first attenuator circuit 22. This enables the input signal from low impedance input source 26 to be fed directly through attenuator circuit 22 to sample switch 14 at the high-impedance terminal 48a. At the same time the input signal from low-impedance input source 26 is also fed through the second attenuator 22a and delivered at its high-impedance output 48aa to sampling switch 46 of back gate circuit 40. Now the input signal can be used in back gate circuit 40 to track in the same way as previously in FIG. 2 so that back gate 24 tracks the input signal in sample switch 14, thereby stabilizing the on resistance of sample switch 14. However, since any distortions of the input signal delivered at high-impedance output 48aa to back gate circuit 40 are isolated from those at 48a, those distortions will not affect the primary signal in the main sample and hold channel. Any distortions reflected back to terminal 80 will not affect the signal to the main channel since the input source 26 is a low-impedance source.

Figure 5:
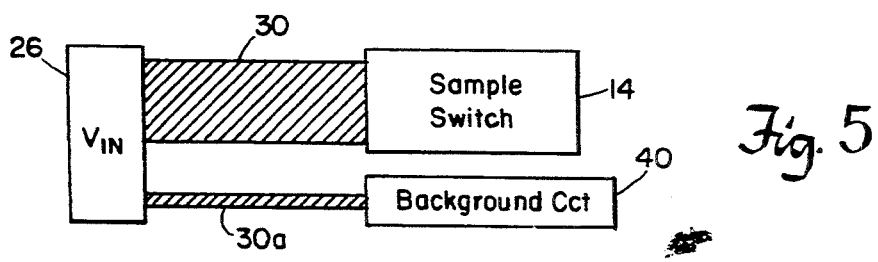
FIG. 5 is a schematic diagram showing one of the resistances in each of the attenuator circuits of FIG. 4 illustrating the substantially smaller physical size of the resistances used in the second attenuator.

Second attenuator 22a may have its resistances 28a, 30a and 32a identical with respect to resistances 28, 30 and 32 of first attenuator 22, but they need not be. In fact, one of the elegant features of this invention is that resistances 28a, 30a and 32a may be multiples of resistances 28, 30 and 32. That is, they may be much increased in resistance. In integrated circuit fabrication, the increased resistance translates into a physically smaller element. Thus as shown in FIG. 5, while resistance 30 may appear physically of a size as shown in FIG. 5, resistance 30a may be much smaller and narrower, so that this invention, in addition to being a solution to the parasitic capacitance problem between the back gate and substrate of the integrated circuit implemented sample and hold channel, makes its contribution with a minimum of additional space required on the integrated circuit chip and uses only passive elements to accomplish that contribution.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. An improved back gate switched sample and hold circuit, comprising:
    a sample and hold channel including a sample switch having a back gate and a storage element;
    a back gate circuit for controlling the back gate of said sample switch; and
    a first attenuator circuit for scaling the input signal from a low impedance source for delivery to said sample switch and a second attenuator circuit responsive to the input signal from the low impedance source to independently drive said back gate circuit and isolate any distortion of the input signal in said back gate circuit from affecting the input signal in said sample and hold channel.

2. The improved back gate switched sample and hold circuit of claim 1 in which said first and second attenuator circuits are first and second resistance circuits, respectively.

3. The improved back gate switched sample and hold circuit of claim 2 in which said first and second resistance circuits have substantially identical resistance.

4. The improved back gate switched sample and hold circuit of claim 2 in which said first and second resistance circuits have proportional resistance.

5. The improved back gate switched sample and hold circuit of claim 4 in which said second resistance circuit includes resistances which are proportionally greater than the resistance of said first resistance circuit.

6. The improved back gate switched sample and hold circuit of claim 2 in which said sample switch is a transistor.

7. The improved back gate switched sample and hold circuit of claim 2 in which said sample switch is an FET transistor.

8. The improved back gate switched sample and hold circuit of claim 2 in which said storage element is a capacitor.

9. The improved back gate switched sample and hold circuit of claim 2 in which said back gate circuit includes a sampling switch for connecting the input signal to said back gate during the sample operation and a holding switch for connecting said back gate to ground during the hold operation.

10. The improved back gate switched sample and hold circuit of claim 9 in which both said sampling switch and said holding switch are transistors.

11. The improved back gate switched sample and hold circuit of claim 10 in which both said transistors are FETs.

* * * * *